(12) United States Patent
Choi et al.

(10) Patent No.: US 11,018,200 B2
(45) Date of Patent: May 25, 2021

(54) DISPLAY DEVICE HAVING A WHITE EMITTING AREA

(71) Applicant: LG Display Co., Ltd., Seoul (KR)

(72) Inventors: Ho-Won Choi, Paju-si (KR); Moon-Bae Gee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 321 days.

(21) Appl. No.: 15/792,576

(22) Filed: Oct. 24, 2017

(65) Prior Publication Data

US 2018/0122862 A1    May 3, 2018

(30) Foreign Application Priority Data

Oct. 28, 2016   (KR) .................. 10-2016-0141874

(51) Int. Cl.
| H01L 27/32 | (2006.01) |
| H01L 51/52 | (2006.01) |
| H01L 27/12 | (2006.01) |
| G02F 1/1335 | (2006.01) |
| G02F 1/1343 | (2006.01) |
| G02F 1/1362 | (2006.01) |

(52) U.S. Cl.
CPC ........ *H01L 27/322* (2013.01); *H01L 27/1259* (2013.01); *H01L 27/3246* (2013.01); *H01L 27/3262* (2013.01); *H01L 51/5284* (2013.01); *G02F 1/13439* (2013.01); *G02F 1/133514* (2013.01); *G02F 1/136209* (2013.01); *H01L 27/3213* (2013.01); *H01L 27/3258* (2013.01); *H01L 51/5271* (2013.01)

(58) Field of Classification Search
CPC .................................................. H01L 27/3244
See application file for complete search history.

(56) References Cited

U.S. PATENT DOCUMENTS

| 8,087,964 B2 | 1/2012 | Yang et al. |
| 9,123,669 B2 | 9/2015 | Fujino |

(Continued)

FOREIGN PATENT DOCUMENTS

| CN | 103165824 A | 6/2013 |
| EP | 1 791 182 A2 | 5/2007 |

(Continued)

OTHER PUBLICATIONS

European Patent Office, Extended European Search Report and Opinion, EP Patent Application No. 17198953.6, dated Apr. 5, 2018, seven pages.

(Continued)

*Primary Examiner* — Moazzam Hossain
*Assistant Examiner* — Hajar Kolahdouzan
(74) *Attorney, Agent, or Firm* — Fenwick & West LLP

(57) ABSTRACT

A display device including color filters overlapping each other on a non-emitting area of an upper substrate which is opposite to a lower substrate is provided. In the display device, color filters disposed close to a white emitting area include a same material, and the color filters extend a greater distance onto a non-emitting area disposed near the white emitting area, relative to distances extended onto other non-emitting areas. Thus, the display device may prevent light-leakage from the white emitting area.

20 Claims, 5 Drawing Sheets

(56) References Cited

U.S. PATENT DOCUMENTS

| | | | | |
|---|---|---|---|---|
| 2003/0117573 A1* | 6/2003 | Yi | ................... | G02F 1/1333 |
| | | | | 349/158 |
| 2007/0123135 A1* | 5/2007 | Yang | ................ | H01L 27/3213 |
| | | | | 445/24 |
| 2014/0231790 A1 | 8/2014 | Fujino | | |
| 2014/0306200 A1* | 10/2014 | Jinta | ................ | H01L 27/3246 |
| | | | | 257/40 |
| 2015/0221710 A1* | 8/2015 | Motoyama | .......... | H01L 27/3216 |
| | | | | 257/89 |
| 2015/0318447 A1 | 11/2015 | Choi | | |

FOREIGN PATENT DOCUMENTS

| | | | |
|---|---|---|---|
| JP | 2007-149693 A | | 6/2007 |
| JP | 2009-104969 A | | 5/2009 |
| JP | 2014-154482 A | | 8/2014 |
| KR | 10-2007-0056468 A | | 6/2007 |
| KR | 10-2015-0129551 | * | 11/2015 |
| KR | 10-2015-0129551 A | | 11/2015 |
| WO | WO 2013/051428 A | | 4/2013 |

OTHER PUBLICATIONS

Japan Patent Office, Notification of Reasons for Refusal, JP Patent Application No. 2017-204955, dated Oct. 23, 2018, nine pages.
European Patent Office, Communication pursuant to Article 94(3) EPC, EP Patent Application No. 17198953.6, dated Aug. 26, 2020, five pages.
China National Intellectual Property Administration, Office Action, CN Patent Application No. 201711012662.0, dated Mar. 26, 2021, 13 pages.

* cited by examiner

DISPLAY DEVICE HAVING A WHITE EMITTING AREA

CROSS-REFERENCE TO RELATED APPLICATION

This application claims priority under 35 U.S.C. § 119(a) of Republic of Korea Patent Application No. 10-2016-0141874, filed on Oct. 28, 2016, which is hereby incorporated by reference in its entirety.

BACKGROUND

Technical Field

The present disclosure relates to a display device including a white emitting area, and color filters overlapping each other on non-display area in order to serve as a black matrix.

Discussion of the Related Art

Generally, an electronic appliance, such as a monitor, a TV, a laptop computer, and a digital camera, includes a display device to display an image. For example, the display device may include a liquid crystal display device and an organic light-emitting display device.

The display device may include emitting areas which emit different color light from each other, in order to display various images. For example, the display device may include green emitting areas realizing green color, red emitting areas realizing red color, blue emitting areas realizing blue color, and white emitting areas realizing white color.

A light-emitting structure generating a light of a specific color may be disposed on each emitting area of the display device. For example, the display device may include a green color filter on the green emitting area, a red color filter on the red emitting area, and a blue color filter on the blue emitting area.

The color filters of the display device may overlap on a non-emitting area between the emitting areas. The color filters overlapping on the non-emitting area may serve as a black matrix. The method for fabricating the display device may not include a process of forming the black matrix.

However, in the display device, because the color filters must be not formed on adjacent emitting areas, the color filters may be formed to partially cover the non-emitting areas around the corresponding emitting area in consideration of a process margin. For example, the color filters may be stacked only at the center of each non-emitting area. Thus, in the white emitting area of the display device surrounded by non-emitting area in which the color filters are not overlapped, the light generated by adjacent emitting areas may be easily introduced without passing through the color filter. Therefore, in the display device, the light-leakage caused by the light emitted through the white emitting area without passing through the color filter may occur.

SUMMARY

Accordingly, embodiments of the present invention are directed to a display device having a white emitting area that substantially obviates one or more problems due to limitations and disadvantages of the related art.

One object of the present invention is to provide a display device that prevents the light-leakage without forming a black matrix.

Another object of the present invention is to provide a display device that prevents light emitting through the white emitting area without passing through the color filter.

Additional advantages, objects, and features of embodiments of the invention will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these objects and other advantages and in accordance with an embodiment of the invention, as embodied and broadly described herein, there is provided a display device including a lower substrate having a display area. An upper substrate is disposed on the display area of the lower substrate. The upper substrate includes a white emitting area, a first non-emitting area, a first emitting area, a second non-emitting area, and a second emitting area which are disposed side by side. A first color filter is disposed on the first emitting area of the upper substrate. The first color filter extends by a first distance onto the first non-emitting area and extends by a second distance onto the second non-emitting area. A second color filter is disposed on the second emitting area of the upper substrate. The second color filter overlaps with the first color filter on the second non-emitting area. The first distance of the first color filter extending onto the first non-emitting area of the upper substrate is greater than the second distance of the first color filter extending onto the second non-emitting area of the upper substrate.

The first color filter on the second non-emitting area of the upper substrate may be disposed between the upper substrate and the second color filter.

A first width of the first non-emitting area may be equal to a second width of the second non-emitting area.

A first distance of the first color filter may be greater than a second distance of the second color filter.

In some embodiments, the display device further comprises a third color filter may be disposed on a third emitting area of the upper substrate overlapping with the display area of the lower substrate. The third color filter may extend onto a third non-emitting area between the white emitting area and the third emitting area. The third color filter may be made of a same material as the first color filter.

A third distance of the third color filter on the third non-emitting area of the upper substrate may be equal to the first distance of the first color filter on the first non-emitting area of the upper substrate.

A first width of the first emitting area and a second width of the third emitting area may each be less than a third width of the second emitting area.

A fourth width of the white emitting area may be equal to the third width of the second emitting area.

The sum of the first width of the first emitting area and the second width of the third emitting area may be equal to the third width of the second emitting area.

The first width of the first emitting area may be less than the second width of the third emitting area.

In some embodiments, the display device further comprises a lower align key disposed on a non-display area of the lower substrate, which is disposed outside the display area. The display device may also further comprise an upper align key disposed on the upper substrate aligned with the lower align key. The upper align key may be made of a same material as the first color filter.

In some embodiments, the display device further comprises a white light-emitting structure, a first light-emitting structure, a second light-emitting structure, and a bank insulating layer disposed on the display area of the lower substrate. The white light-emitting structure may overlap with the white emitting area of the upper substrate. The first light-emitting structure may overlap with the first emitting area of the upper substrate. The second light-emitting structure may overlap with the second emitting area of the upper substrate. The bank insulating layer may overlap with the first non-emitting area and the second non-emitting area of the upper substrate. The white light-emitting structure, the first light-emitting structure, and the second light-emitting structure may include a white light-emitting layer.

In accordance with another aspect of the present invention, there is provided a display device including a first row and a second row. The first row includes a first white emitting area, a first emitting area, and a second emitting area emitting different colors of light from each other. The white emitting area, the first emitting area, and the second emitting area are repeatedly arranged. The second row includes a second white emitting area, a third emitting area, and a fourth emitting area arranged in a staggered order relative to the emitting areas of the first row. The first white emitting area and the second white emitting area are each surrounded by at least two other emitting areas.

Each row may further include another emitting area emitting a different color of light than that of light emitted by the white emitting area, the first emitting area and the second emitting area. In an embodiment, the first emitting area is a blue emitting area, the second emitting area is a green emitting area, and the third emitting area is a red emitting area.

In an embodiment, a first size of the first emitting area on a first side of the white emitting area is different from a second size of the first emitting area on a second side of the white emitting area. The second side of the white emitting area is opposite to the first side of the white emitting area.

In another embodiment, a display device comprises a lower substrate, a light emitting structure, and an upper substrate. The light emitting structure is on the lower substrate and emits white light. The upper substrate includes (i) a first non-emitting area between a first emitting area and a second emitting area, and (ii) a second non-emitting area between a white emitting area and the second emitting area. The display device further comprises a first and second color filter. The first color filter overlaps the first emitting area and at least part of the first non-emitting area. The second color filter overlaps the second emitting area. The second color filter extends by: (i) a first distance into a first portion of the first color filter in the first non-emitting area to block the white light from emitting from the first portion and (ii) a second distance into a second portion of the second non-emitting area to prevent leaking of the white light through the second portion. The second distance is greater than the first distance.

In an embodiment, the display device further comprises a third color filter overlapping a third emitting area adjacent to a third non-emitting area. The white emitting area is between the second non-emitting area and the third non-emitting area. The third color filter may have a same color as the second color filter. The third color filter extends by a third distance into a third portion of the third non-emitting area to prevent leaking of the white light through the third portion.

In an embodiment, the white emitting area is adjacent to the second first color filter and the third color filter in a first direction of the display device. The display device further comprises a fourth and fifth color filter. The fourth color filter may have the same color as the second color filter. The fifth color filter may also have the same color as the second color filter. The white emitting area may be adjacent to the fourth color filter and the fifth color filter in a second direction orthogonal to the first direction of the display device.

BRIEF DESCRIPTION OF THE DRAWINGS

The accompanying drawings, which are included to provide a further understanding of embodiments of the invention and are incorporated in and constitute a part of this application, illustrate embodiments of the invention and together with the description serve to explain principles of embodiments of the invention. In the drawings.

DETAILED DESCRIPTION

Figure 1A:
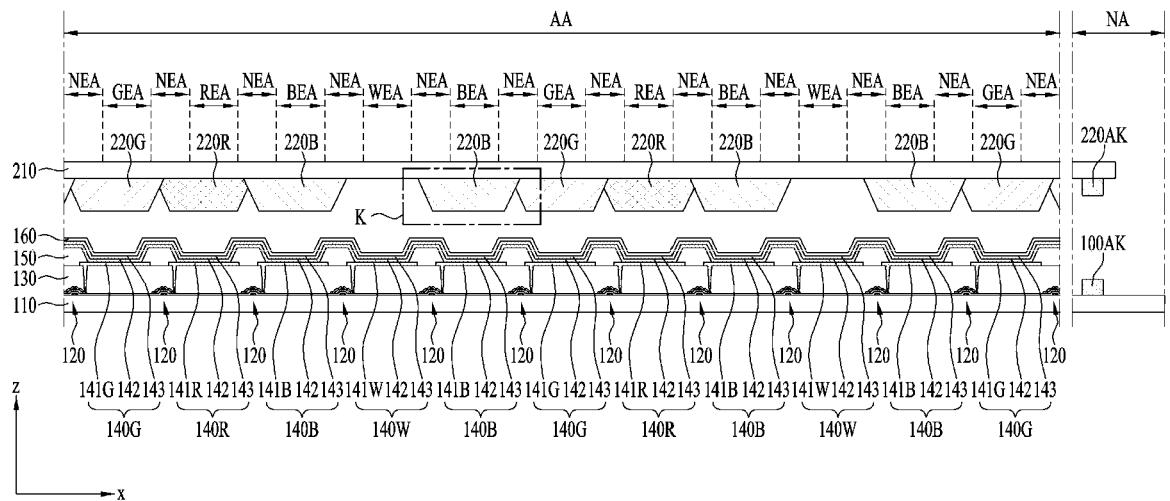
FIG. 1A is a cross-sectional view of a display device according to an embodiment of the present invention.

Hereinafter, details related to the above objects, technical configurations, and operational effects of the embodiments of the present invention will be clearly understood by the following detailed description with reference to the drawings, which illustrate some embodiments of the present invention. Here, the embodiments of the present invention are provided in order to allow the technical sprit of embodiments of the present invention to be satisfactorily transferred to those skilled in the art, and thus the present invention may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of embodiments of the present invention.

The terms used herein are merely used in order to describe particular embodiments, and are not intended to limit the scope of the present invention. For example, an element described in the singular form may include a plurality of elements unless the context clearly indicates otherwise. In addition, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 1B:
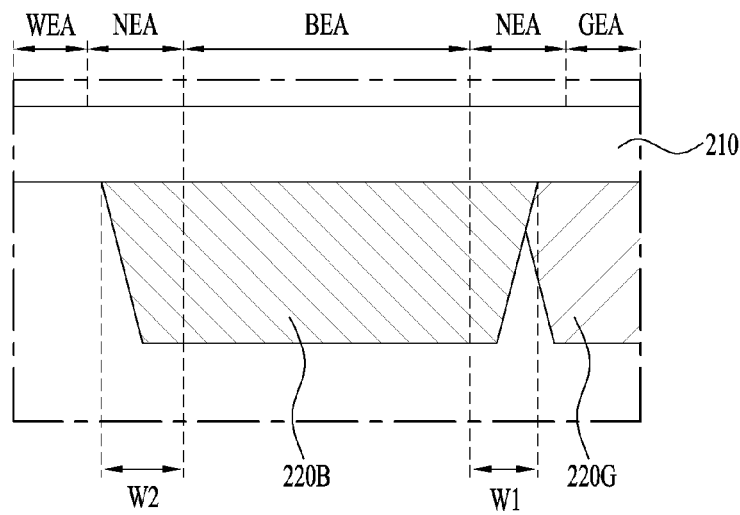
FIG. 1B is an enlarged view of region K of the display device shown in FIG. 1A according to an embodiment of the present invention.
Figure 2:
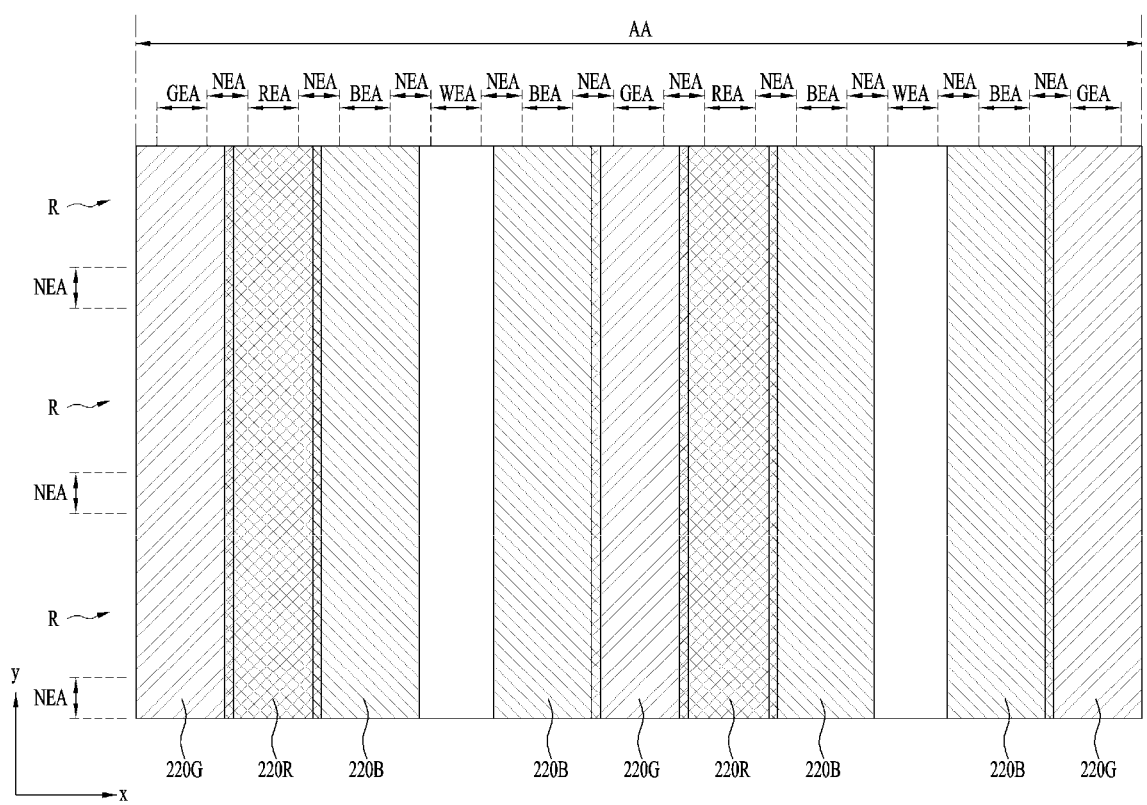
FIG. 2 is a top view of the display device shown in FIG. 1A according to an embodiment of the present invention.

FIG. 1A is a cross-sectional view of a display device according to an embodiment of the present invention. FIG. 1B is an enlarged view of region K of the display device shown in FIG. 1A according to an embodiment of the present invention. FIG. 2 is a top view of the display device shown in FIG. 1A according to an embodiment of the present invention.

Referring to FIGS. 1A, 1B, and 2, the display device according to an embodiment of the present invention may comprise a lower substrate 110, light-emitting structures 140G, 140R, 140B, and 140W, an upper substrate 210 and color filters 220G, 220R, and 220B.

The lower substrate 110 may support the light-emitting structures 140G, 140R, 140B, and 140W. The lower substrate 110 may include an insulating material. For example, the lower substrate 110 may include glass or plastic.

The lower substrate 110 may include a display area AA and a non-display area NA. The non-display area NA of the lower substrate 110 may be disposed outside the display area AA of the lower substrate 110. For example, the non-display area NA of the lower substrate 110 may be disposed near an edge of the lower substrate 110.

The display area AA of the lower substrate 110 may include emitting areas GEA, REA, BEA, and WEA, and non-emitting areas NEA. The non-emitting areas NEA may be disposed between the emitting areas GEA, REA, BEA, and WEA. The emitting areas GEA, REA, BEA, and WEA may be separated by the non-emitting areas NEA. The non-emitting areas NEA may also be connected to each other.

The emitting areas GEA, REA, BEA, and WEA of the lower substrate 110 may emit different color lights from each other. For example, the lower substrate 110 may include green emitting areas GEA emitting green color light, red emitting areas REA emitting red color light, blue emitting areas BEA emitting blue color light, and white emitting areas WEA emitting white color light. A green emitting area GEA, a red emitting area REA, a blue emitting area BEA, and a white emitting area WEA may have a same size or different sizes.

The emitting areas GEA, REA, BEA, and WEA may be arranged in a first direction X and a second direction Y perpendicular to the first direction X, as shown in FIG. 2. For example, the non-emitting area NEA may have a mesh shape. The green emitting area GEA, the red emitting area REA, the blue emitting area BEA, and the white emitting area WEA may have the same width in the first direction X. Further, the green emitting area GEA, the red emitting area REA, the blue emitting area BEA, and the white emitting area WEA may have a same length in the second direction Y, as illustrated in FIG. 2. Thus, in some embodiments, the green emitting area GEA, the red emitting area REA, the blue emitting area BEA may have the same planar shape, e.g., same width in the direction X and length in the direction Y. A width of the non-emitting area NEA in the first direction X between the adjacent emitting areas GEA, REA, BEA, or WEA in the first direction X may be equal to a length of the non-emitting area NEA in the second direction Y between the adjacent emitting areas GEA, REA, BEA, or WEA in the second direction Y.

The emitting areas GEA, REA, BEA, and WEA arranged in the first direction X may have a different relationship with the emitting areas GEA, REA, BEA, and WEA arranged in the second direction Y. For example, the emitting areas GEA, REA, BEA, and WEA are arranged such that different colors of light are emitted by the emitting areas along a given line in the first direction X. Further, the emitting areas GEA, REA, BEA and WEA arranged such that one color of light is emitted along another given line in the second direction Y. The emitting areas GEA, REA, BEA, and WEA arranged in the first direction X may be defined as a row R. For example, as shown in FIGS. 1A and 2, a row R may include a repeating pattern of BEA, GEA, REA, BEA, and WEA emitting areas. In other embodiments, the emitting areas may be arranged in any other order or combination of BEA, GEA, REA, and WEA emitting areas. The emitting areas GEA, REA, or BEA may be disposed around the white emitting area WEA. For example, each row R of the emitting areas GEA, REA, BEA, and WEA may be repeated in the order the green emitting area GEA, the red emitting area REA, the blue emitting area BEA, and the white emitting area WEA.

The display device according to the embodiment of shown in FIG. 1A may further include thin film transistors 120 on the display area AA of the lower substrate 110. The emitting areas GEA, REA, BEA, and WEA may be independently driven by the thin film transistors 120. Each thin film transistor 120 may include a gate electrode contacting with the lower substrate 110, a gate insulating layer on the gate electrode, a semiconductor pattern on the gate insulating layer, a source electrode connected to one edge of the semiconductor pattern, and a drain electrode connected to other edge of the semiconductor pattern. Each thin film transistor 120 may further include a etch stopper covering the semiconductor pattern between the source electrode and the drain electrode.

In the display device according to the embodiment shown in FIG. 1A, the thin film transistor 120 is in contact with the lower substrate 110. However, a display device according to another embodiment of the present invention may include a buffer layer between the lower substrate 110 and the thin film transistor 120. The buffer layer includes an insulating material. For example, the buffer layer may include silicon oxide.

In the display device according to the embodiment shown in FIG. 1A, the gate electrode of each thin film transistor is disposed near the lower substrate 110. However, in a display device according to another embodiment, a gate electrode of a thin film transistor 120 may be disposed between the source electrode of the semiconductor pattern and the drain electrode of the semiconductor pattern.

The display device according to the embodiment shown in FIG. 1A may further comprise a planarization layer 130 on the thin film transistors 120. The planarization layer 130 may remove a thickness difference due to the thin film transistors 120. For example, an upper surface of the planarization layer 130 may be parallel with an upper surface of the lower substrate 110. The planarization layer 130 may include an insulating material. For example, the planarization layer 130 may include silicon oxide.

The display device according to the embodiment of shown in FIG. 1A includes thin film transistors 120 in direct contact with the planarization layer 130. However, a display device according to another embodiment may further include a lower passivation layer between the thin film transistors 120 and the planarization layer 130. The lower passivation layer may include an insulating material. The lower passivation layer may include a material different from material(s) of the planarization layer 130. For example, the lower passivation layer may include silicon nitride.

The light-emitting structures 140G, 140R, 140B, and 140W may emit a specific color of light. The light-emitting structures 140G, 140R, 140B, and 140W may include a lower electrode 141G, 141R, 141B and 141W, respectively, a light-emitting layer 142, and an upper electrode 143, which are sequentially stacked.

The light-emitting structures 140G, 140R, 140B, and 140W may be disposed on the display area AA of the lower substrate 110. Each light-emitting structure 140G, 140R, 140B, and 140W may overlap with one or more of the emitting areas GEA, REA, BEA and WEA of the lower substrate 110. For example, a green light-emitting structure 140G overlaps with the green emitting area GEA, a red light-emitting structure 140R overlaps with the red emitting area REA, a blue light-emitting structure 140B overlaps with the blue emitting area BEA, and a white light-emitting structure 140W overlaps with the white emitting area WEA.

The light-emitting structures 140G, 140R, 140B, and 140W may be selectively driven by the thin film transistors 120. For example, the lower electrodes 141G, 141R, 141B, and 141W of the light-emitting structures 140G, 140R, 140B, and 140W, respectively, may be electrically connected to the corresponding thin film transistor 120. The light-emitting structures 140G, 140R, 140B, and 140W may be disposed on the planarization layer 130. Further, the planarization layer 130 may include contact holes that expose the drain electrodes of the thin film transistors 120.

The lower electrodes 141G, 141R, 141B, and 141W may be made of a high-reflective material. For example, the lower electrode 141G, 141R, 141B, and 141W may include a metal, such as aluminum (Al) or argentum (Ag). The lower electrode 141G, 141R, 141B, and 141W may have a multi-layer structure. For example, the lower electrode 141G, 141R, 141B, and 141W may have a structure in which a reflective electrode including a high-reflective material is disposed between transparent electrodes made of a transparent conductive material, such as ITO or IZO.

The lower electrodes 141G, 141R, 141B, and 141W of the light-emitting structures 140G, 140R, 140B, and 140W, respectively, may be spaced apart and insulated from the lower electrodes 141G, 141R, 141B, and 141W of the adjacent light-emitting structure 140G, 140R, 140B, and 140W, respectively. For example, the display device according to the embodiment shown in FIG. 1A may further include a bank insulating layer 150 filling a space between the adjacent lower electrodes 141G, 141R, 141B, and 141W.

The bank insulating layer 150 may cover an edge of the lower electrodes 141G, 141R, 141B, and 141W. The light-emitting layer 142 and the upper electrode 143 may be stacked on a portion of the corresponding lower electrode 141G, 141R, 141B, and 141W exposed by the bank insulating layer 150. The bank insulating layer 150 may overlap with the non-emitting area NEA of the lower substrate 110. The emitting areas GEA, REA, BEA, and WEA of the lower substrate 110 may overlap with the lower electrodes 141G, 141R, 141B, and 141W between portions of the bank insulating layer 150. Boundaries of the emitting areas GEA, REA, BEA, and WEA may be defined by the bank insulating layer 150.

The bank insulating layer 150 may be made of an insulating material. For example, the bank insulating layer 150 may include an organic insulating material, such as benzocyclobutene (BCB), polyimide, or photoacryl.

The light-emitting layer 142 may generate light, the brightness of which corresponds to the voltage difference between a lower electrode 141G, 141R, 141B, or 141W and the corresponding upper electrode 143. The light-emitting layer 142 may extend onto the bank insulating layer 150. For example, the light-emitting layer 142 of the adjacent light-emitting structures 140G, 140R, 140B, and 140W may be connected to each other. The light-emitting structures 140G, 140R, 140B, and 140W may generate a light realizing a same color. For example, the light-emitting layer 142 may be a white light-emitting layer which that generates a light realizing a white color.

The display device according to the embodiment shown in FIG. 1A includes light-emitting structures 140G, 140R, 140B, and 140W having a same light-emitting layer 142. However, in a display device according to another embodiment, the light-emitting structures 140G, 140R, 140B, and 140W may include a light-emitting layer 142 having different materials or separate light-emitting layers 142. For example, a display device according to another embodiment of the present invention may include a green light-emitting structure 140G having a green light-emitting layer generating a light realizing a green color, a red light-emitting structure 140R having a red light-emitting layer generating a light realizing a red color, a blue light-emitting structure 140B having a blue light-emitting layer generating a light realizing a blue color and a white light-emitting structure 140W having a white light-emitting layer generating a light realizing a white color.

The light-emitting layer 142 may include an emitting material layer (EML) having an emission material. The emission material may be an organic material, an inorganic material, or a hybrid material. For example, a display device may be an organic light-emitting display device including an organic light-emitting layer 142.

The light-emitting layer 142 may have a multi-layer structure in order to increase luminous efficacy. For example, the light-emitting layer 142 may further include at least one of a hole injection layer (HIL), a hole transporting layer (HTL), an electron transporting layer (ETL), and an electron injection layer (EIL).

The upper electrode 143 may be made of a conductive material. The upper electrode 143 may be made of a material different from material(s) of the lower electrodes 141G, 141R, 141B, and 141W. For example, the upper electrode 143 may be a transparent electrode including a transparent material, such as ITO or IZO. The light generated by the light-emitting layer 142 may emit through the upper electrode 143.

The upper electrode 143 may extend along the light-emitting layer 142. For example, the upper electrode 143 may extend onto (e.g., overlapping) the bank insulating layer 150. The light-emitting structures 140G, 140R, 140B, and 140W may include a same upper electrode 143.

The display device according to the embodiment shown in FIG. 1A may further include a device passivation layer 160 on the light-emitting structures 140G, 140R, 140B, and 140W. The device passivation layer 160 may protect the thin film transistors 120 and the light-emitting structures 140G, 140R, 140B, and 140W from exterior impact, moisture, or other contamination. The device passivation layer 160 may be made of an insulating material. For example, the device passivation layer 160 may include silicon oxide and/or silicon nitride. The device passivation layer 160 may have a multi-layer structure.

The display device according to the embodiment shown in FIG. 1A may further include a lower align key 100AK on the non-display area NA of the lower substrate 110. The lower align key 100AK may be used to align the lower substrate 110 in a process of forming the thin film transistors 120 and/or the light-emitting structures 140G, 140R, 140B, and 140W. The lower align key 100AK may include at least one of the materials used to form the thin film transistors 120 and/or the light-emitting structures 140G, 140R, 140B, and 140W. For example, the lower align key 100AK may include a same material as at least one of the gate electrodes, the source or drain electrodes, and the lower electrodes 141G, 141R, 141B, and 141W.

The upper substrate 210 may be opposite to the lower substrate 110. For example, the upper substrate 210 may be disposed on the light-emitting structures 140G, 140R, 140B, and 140W. The upper substrate 210 may be made of an insulating material. The upper substrate 210 may also be made of a transparent material. For example, the upper substrate 210 may include glass or plastic.

The upper substrate 210 may include the display area AA and the non-display area NA. The display area AA of the upper substrate 210 may overlap with the display area AA of the lower substrate 110. The non-display area NA of the upper substrate 210 may be disposed outside the display area AA of the upper substrate 210. For example, the non-display area NA of the upper substrate 210 may be disposed close to an edge of the upper substrate 210. The non-display area NA of the upper substrate 210 may overlap with the non-display area NA of the lower substrate 110.

The display area AA of the upper substrate 210 may include emitting areas GEA, REA, BEA, and WEA, and non-emitting areas NEA. The emitting areas GEA, REA, BEA, and WEA of the upper substrate 210 may overlap with the emitting areas GEA, REA, BEA, and WEA of the lower substrate 110, respectively. For example, the emitting areas GEA, REA, BEA, and WEA of the upper substrate 210 may include the green emitting area GEA, the red emitting area REA, the blue emitting area BEA, and the white emitting area WEA. The non-emitting areas NEA of the upper substrate 210 may be disposed between the emitting areas GEA, REA, BEA, and WEA of the upper substrate 210. The non-emitting area NEA of the upper substrate 210 may overlap with the non-emitting area NEA of the lower substrate 110.

The emitting areas GEA, REA, BEA, and WEA of the upper substrate 210 may be arranged similarly as the arrangement of the emitting areas GEA, REA, BEA, and WEA of the lower substrate 110. For example, the upper substrate 210 may include rows R repeated in the order the green emitting area GEA, the red emitting area REA, the blue emitting area BEA, and the white emitting area WEA.

The color filters 220G, 220R, and 220B may be disposed on a lower surface of the upper substrate 210 facing the lower substrate 110. The color filters 220G, 220R, and 220B may be disposed between the light-emitting structures 140G, 140R, 140B, and 140W, and the upper substrate 210. The color filters 220G, 220R, and 220B may overlap with one or more of the light-emitting structures 140G, 140R, 140B, and 140W. For example, the color filters 220G, 220R, and 220B may include a green color filter 220G on at least a green light-emitting structure 140G, a red color filter 220R on at least a red light-emitting structure 140R, and a blue color filter 220B on at least a blue light-emitting structure 140B.

The lower surface of the upper substrate 210 overlapping with a white light-emitting structure 140W may be exposed by the color filters 220G, 220R, and 220B.

The color filters 220G, 220R, and 220B may extend onto an adjacent non-emitting area NEA. For example, the color filters 220G, 220R, and 220B may overlap on the adjacent non-emitting area NEA of the upper substrate 210, and may also overlap each other. The color filters 220G, 220R, and 220B stacked on the non-emitting area NEA of the upper substrate 210 may serve as a black matrix. For example, the light generated by each light-emitting structure 140G, 140R, 140B, and 140W may be not leaked to the adjacent emitting area GEA, REA, BEA, or WEA by the stacked color filters 220G, 220R, and/or 220B on the non-emitting area NEA of the upper substrate 210.

The display device according to the embodiment shown in FIG. 1A may further include an upper align key 220AK on the non-display area NA of the upper substrate 210. The upper align key 220AK may be used in a process of attaching the upper substrate 210 to the lower substrate 110. For example, the process of attaching the lower substrate 110 and the upper substrate 210 may include a process of adjusting the position of the upper substrate 210 relative to the position of the lower substrate 110 using the lower align key 100AK and the upper align key 220AK.

The upper align key 220AK may be aligned with the lower align key 100AK, e.g., in an assembled display device. For example, the upper align key 220AK of the upper substrate 210 may overlap with the lower align key 100AK of the lower substrate 110.

The upper align key 220AK may be used in a process of aligning the upper substrate 210 to two of the color filters 220G, 220R, and 220B. For example, the upper align key 220AK may be formed simultaneously with the other one of the color filters 220G, 220R, or 220B. The upper align key 220AK may be made of a same material as the other one of the color filter 220G, 220R, or 220B.

In an embodiment, the upper align key 220AK may include a same material as the blue color filter 220B. Further, the blue color filter 220B covering the blue emitting area BEA around the white emitting area WEA may be formed first, for example, before forming the green color filter 220G and the red color filter 220R. The blue color filter 220B may be disposed between the upper substrate 210 and the green color filter 220G or the red color filter 220R on the non-emitting area NEA between the blue emitting area BEA and the green emitting area GEA or the red emitting area REA. That is, according to an embodiment of the present invention, the blue color filter 220B may be formed without considering the overlapping area of the color filters 220G, 220R, and 220B, and the process margin therefrom. For example, the blue color filter 220B may formed to extend relatively long into the non-emitting area NEA disposed near the white emitting area WEA. A second width W2 of the blue color filter 220B on the non-emitting area NEA (toward the left of FIG. 1B) between the white emitting area WEA and the blue emitting area BEA may be greater than a first width W1 of the blue color filter 220B on the non-emitting area NEA (toward the right of FIG. 1B) between the green emitting area GEA and the blue emitting area BEA. Thus, light generated by the blue light-emitting structure 140B and emitted toward the white emitting area WEA of the upper substrate 210 may pass through the portion of the blue color filter 220B formed on the non-emitting area NEA between the white emitting area WEA and the blue emitting area BEA. That is, the light generated by the blue light-emitting structure 140B may emit light through the blue emitting area BEA or the white emitting area WEA after passing through the blue color filter 220B. Therefore, leakage of white colored light from the white emitting area WEA may be prevented without a black matrix separate from the color filters 220B, 220G, or 220R. Light-leakage herein refers to passing of white light through non-emitting areas without passing through any filters.

The display device according to the embodiment described above includes the blue emitting area BEA disposed around (e.g., adjacent to) the white emitting area WEA. However, in other embodiments, the white emitting area WEA may be surrounded by the green emitting area GEA or the red emitting area REA, and the green color filter 220G or the red color filter 220R may be formed first, for example, before the other two color filters are formed.

In the display device according to the embodiment shown in FIG. 2, the emitting area GEA, REA, BEA, or WEA associated with one given color may be disposed in a second direction Y. Thus, the non-emitting area NEA between the adjacent emitting areas GEA, REA, BEA, or WEA in the second direction Y may be completely covered by one or more of the corresponding color filters 220G, 220R, and 220B.

The display device according to an embodiment of the present invention may further include an adhesive layer (not shown in the figures) between the device passivation layer 160 and the color filters 220G, 220R and 220B. The adhesive layer may partially or completely fill a space between the device passivation layer 160 and the color filters 220G, 220R, and 220B. The upper substrate 210 may be attached to the lower substrate 110 by the adhesive layer.

Accordingly, in various embodiments, the emitting areas GEA, REA, or BEA disposed adjacent or near the white emitting area WEA may be covered by one of the color filters 220G, 220R, or 220B, so that the corresponding color filter 220G, 220R, or 220B may extend relatively long into the non-emitting area NEA adjacent or near the white emitting area WEA. As a result, the display device may prevent light-leakage (of white colored light) by the white emitting area WEA.

Figure 3:
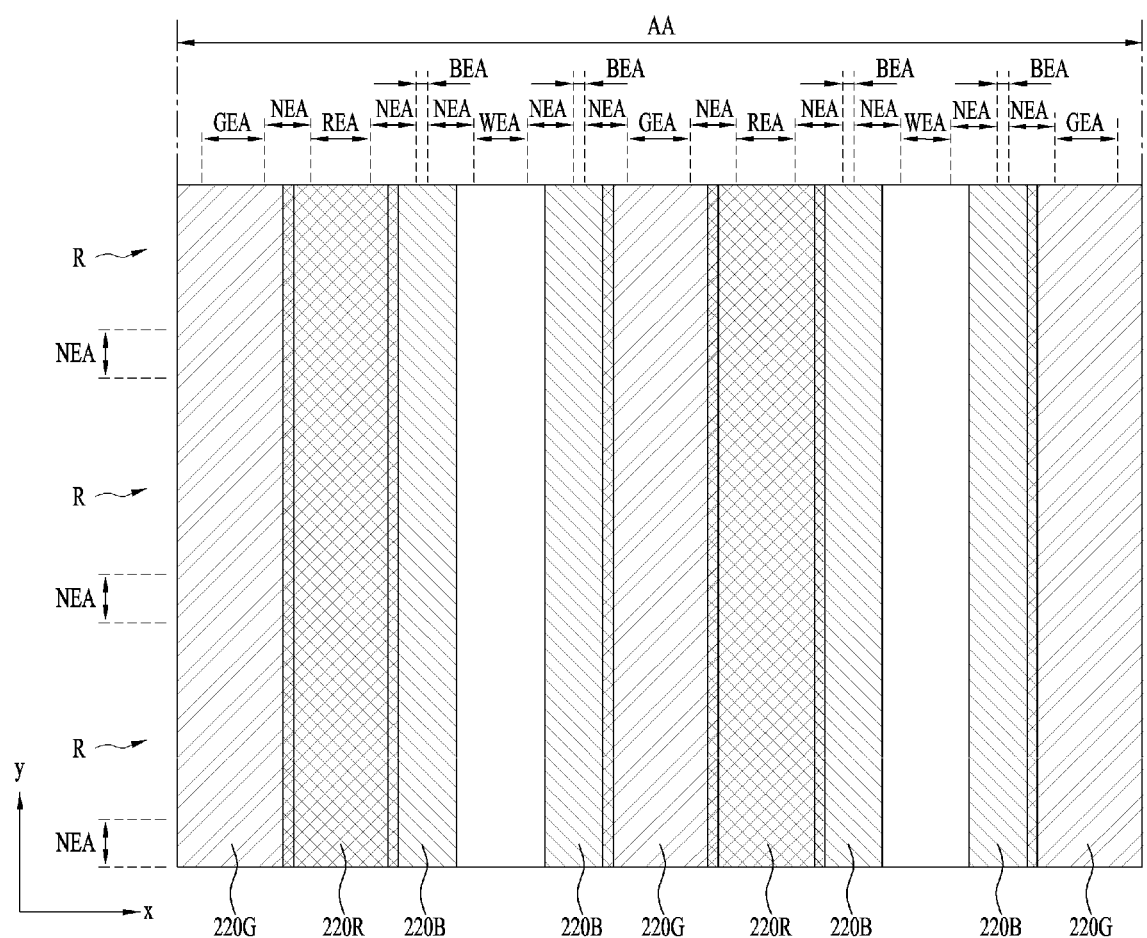
FIGS. 3, 4, and 5 are views showing various examples of a display device according to various embodiments of the present invention.

The display device according to the embodiment shown in FIG. 2 includes a blue emitting area BEA that has a same width and a same size as the green emitting area GEA and the red emitting area REA. However, in another embodiment of the present invention, the width and/or the size of the blue emitting area BEA around the white emitting area WEA may be less than those of the green emitting area GEA and/or the red emitting area REA, as shown in FIG. 3. In the display device according to another embodiment shown in FIG. 3, the width and/or the size of the red emitting area REA may be same as that of the green emitting area GEA. Further, the white emitting area WEA may have the same width and/or the same size as the red emitting area REA and the green emitting area GEA. Additionally, the sum of the width or size (e.g., area in the X-Y plane) of two blue emitting areas BEA around the white emitting area WEA (e.g., adjacent to the left and right sides of the white emitting area WEA) may be equal to the width or size, respectively, of the green emitting area GEA. In another embodiment of the present invention, the sum of the horizontal distance of two blue emitting areas BEA which are disposed around the white emitting area WEA may be equal to the horizontal distance of the green emitting area GEA.

Figure 4:
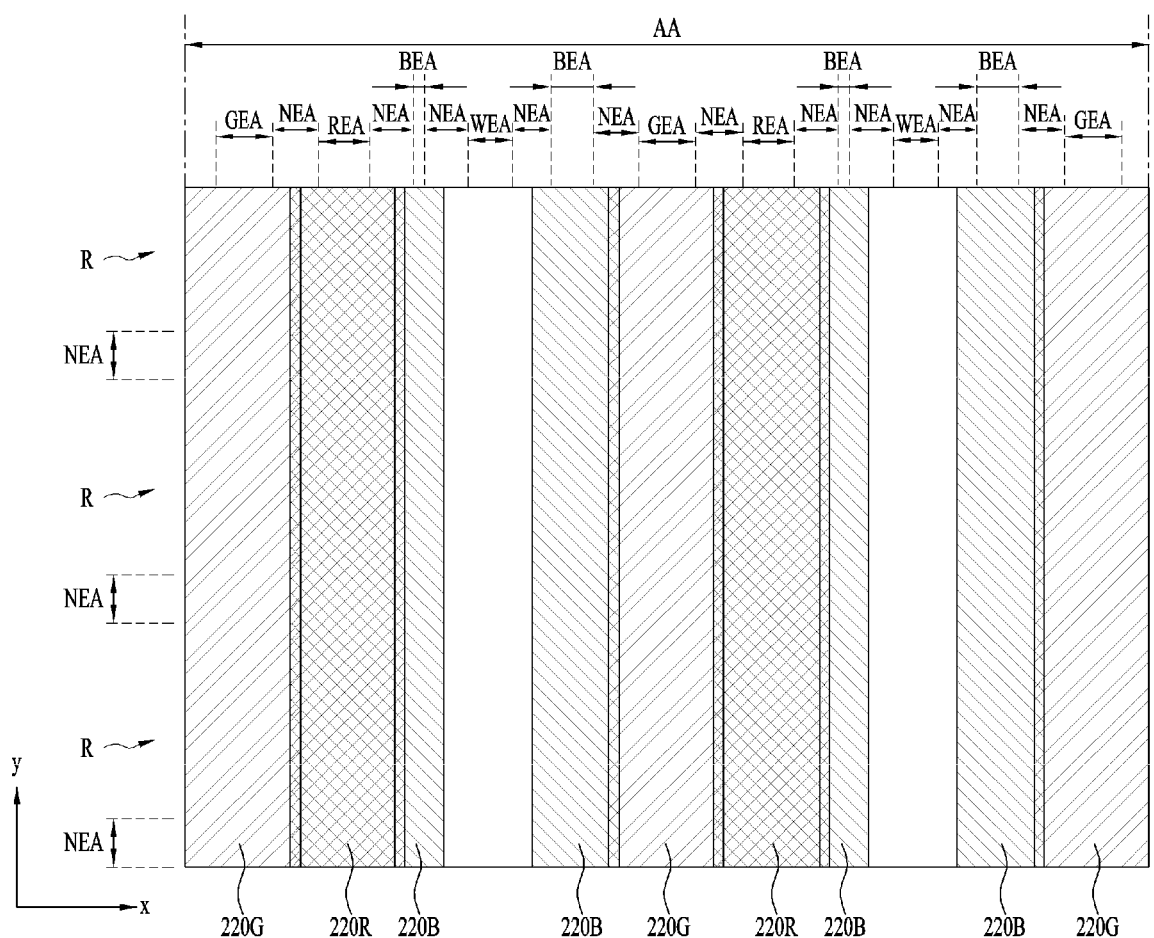

The display device according to the embodiment shown in FIG. 3 includes the blue emitting area BEA on a first (e.g., left) side of the white emitting area WEA having a same width or size as that of the blue emitting area BEA on a second (e.g., right) side of the white emitting area WEA, opposite to the first side. However, in the display device according to another embodiment shown in FIG. 4, the width and/or the size of the blue emitting areas BEA on the first and the second sides of the white emitting area WEA may be different. As illustrated in FIG. 4, the blue emitting area BEA on the first side of the white emitting area WEA and the blue emitting area BEA on the second side of the white emitting area WEA may have a different width and/or size than those of the green emitting area GEA or the red emitting area REA.

Figure 5:
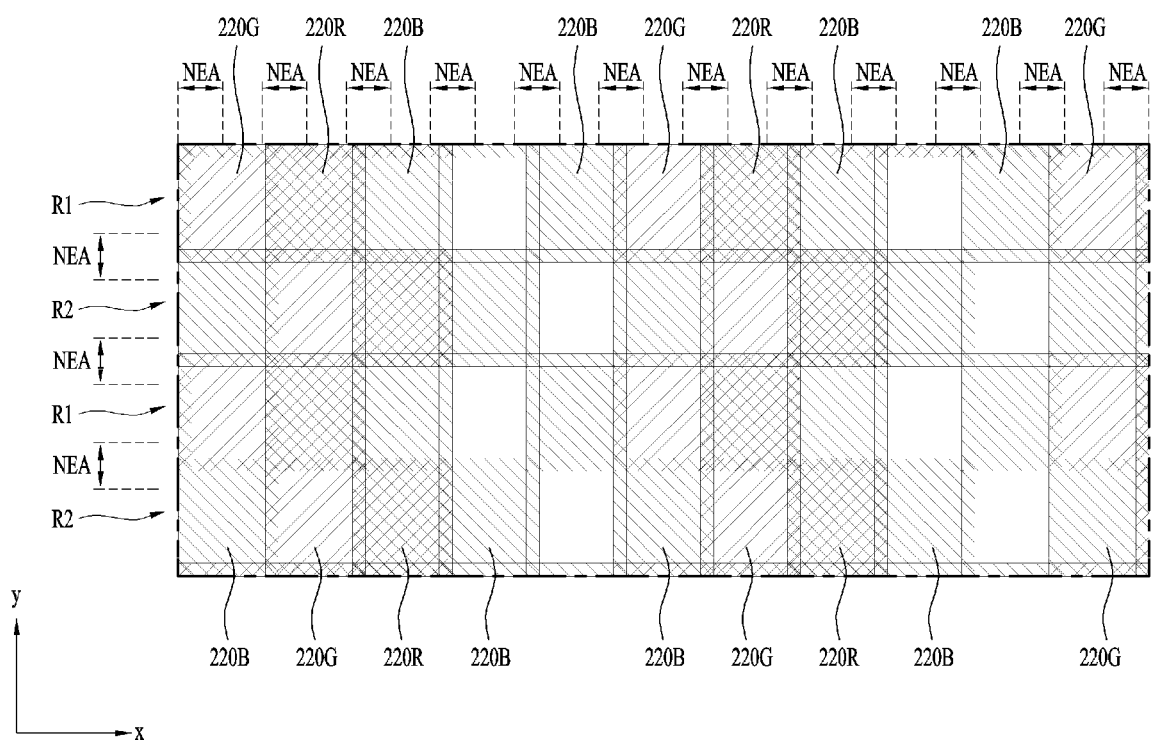

The display device according to the embodiment shown in FIGS. 2-4 include adjacent emitting areas GEA, REA, BEA, and WEA in the second direction Y. However, a display device according to the embodiment shown in FIG. 5 may include a first row R1 and a second row R2 of emitting areas that are repeated in a particular order (e.g., a sequential pattern). The emitting areas GEA, REA, BEA, and WEA of the second row R2 may be aligned to be staggered relative to the emitting areas GEA, REA, BEA, and WEA of the first rows R1. For example, the pattern of emitting areas in the first row r1 may be offset by one (or any other number) of the emitting areas in the pattern, relative to another pattern of emitting areas in the second row r2. Thus, as illustrated in FIG. 5, the first blue emitting area BEA may be disposed on four sides of the white emitting area WEA. Therefore, in the display device according to an embodiment of the present invention, light-leakage by the white emitting area may be efficiently prevented without a black matrix.

Consequently, in the display device according to the embodiments of the present invention, the emission of the light generated in the emitting area without passing through the color filter may be prevented without a black matrix. Thus, in the display device according to the embodiments of the present invention, the light-leakage due to the white emitting area may be prevented without the black matrix. White colored light that may have leaked instead passes through a color filter (e.g., 220G, 220R, and 220B) and becomes emitted from the display device as colored light (e.g., green, red, or blue). Therefore, in the display device according to the embodiments of the present invention, the production efficiency and quality of images displayed by the display device may be improved.

What is claimed is:

1. A display device comprising:
   a lower substrate including a display area;
   an upper substrate including a white emitting area, a first emitting area, a first non-emitting area between the white emitting area and the first emitting area, a second emitting area, a second non-emitting area between the first emitting area and the second emitting area, a third emitting area, and a third non-emitting area disposed between the white emitting area and the third emitting area, which are disposed on the display area of the lower substrate;
   a first color filter on the first emitting area of the upper substrate, the first color filter extending by a first distance onto the first non-emitting area and extending by a second distance onto the second non-emitting area;
   a second color filter on the second emitting area of the upper substrate, the second color filter overlapping with the first color filter on the second non-emitting area; and
   a third color filter on the third emitting area of the upper substrate, the third color filter extending onto the third non-emitting area, wherein the first distance of the first color filter extending onto the first non-emitting area of the upper substrate is greater than the second distance of the first color filter extending onto the second non-emitting area of the upper substrate, and wherein the third color filter includes a same material as the first color filter.

2. The display device according to claim 1, wherein the first color filter on the second non-emitting area of the upper substrate is disposed between the upper substrate and the second color filter.

3. The display device according to claim 1, wherein a first width of the first non-emitting area is substantially equal to a second width of the second non-emitting area.

4. The display device according to claim 3, wherein a first distance of the first color filter is greater than a second distance of the second color filter.

5. The display device according to claim 1, wherein a third distance of the third color filter extending onto the third non-emitting area of the upper substrate is greater than the second distance of the first color filter extending onto the second non-emitting area of the upper substrate.

6. The display device according to claim 5, wherein the third distance of the third color filter on the third non-emitting area of the upper substrate is substantially equal to the first distance of the first color filter on the first non-emitting area of the upper substrate.

7. The display device according to claim 5, wherein a first width of the first emitting area and a second width of the third emitting area are each less than a third width of the second emitting area.

8. The display device according to claim 7, wherein a fourth width of the white emitting area is substantially equal to the third width of the second emitting area.

9. The display device according to claim 7, wherein a sum of the first width of the first emitting area and the second width of the third emitting area is substantially equal to the third width of the second emitting area.

10. The display device according to claim 9, wherein the first width of the first emitting area is less than the second width of the third emitting area.

11. The display device according to claim 1, further comprising:
a lower align key on a non-display area of the lower substrate, the non-display area disposed outside the display area; and
an upper align key on the upper substrate, the upper align key aligned with the lower align key,
wherein the upper align key is made of a same material as the first color filter.

12. The display device according to claim 1, further comprising:
a white light-emitting structure on the display area of the lower substrate, the white light-emitting structure overlapping with the white emitting area of the upper substrate;
a first light-emitting structure on the display area of the lower substrate, the first light-emitting structure overlapping with the first emitting area of the upper substrate;
a second light-emitting structure on the display area of the lower substrate, the second light-emitting structure overlapping with the second emitting area of the upper substrate;
a third light-emitting structure on the display area of the lower substrate, the third light-emitting structure overlapping with the third emitting area of the upper substrate; and
a bank insulating layer on the display area of the lower substrate, the bank insulating layer overlapping the first non-emitting area, the second non-emitting area, and the third non-emitting area of the upper substrate,
wherein each of the white light-emitting structure, the first light-emitting structure, the second light-emitting structure, and the third light-emitting structure includes a white light-emitting layer.

13. A display device comprising:
a lower substrate including a display area;
an upper substrate including a white emitting area, a first emitting area, a first non-emitting area between the white emitting area and the first emitting area, a second emitting area, a second non-emitting area between the first emitting area and the second emitting area, a third emitting area, and a third non-emitting area disposed between the white emitting area and the third emitting area, which are disposed on the display area of the lower substrate;
a first color filter on the first emitting area of the upper substrate, the first color filter extending by a first distance onto the first non-emitting area and extending by a second distance onto the second non-emitting area;
a first row including the white emitting area, the first emitting area, the second emitting area, and the third emitting area emitting different colors of light from each other, the white emitting area, the first emitting area, the second emitting area, and the third emitting area repeatedly arranged; and
a second row including the white emitting area, the first emitting area, the second emitting area, and the third emitting area arranged in a staggered order relative to the emitting areas of the first row,
wherein emitting areas adjacent to the white emitting area in direction of a row or a column realize a same color,
wherein the first distance of the first color filter extending onto the first non-emitting area of the upper substrate is greater than the second distance of the first color filter extending onto the second non-emitting area of the upper substrate.

14. The display device according to claim 13, wherein the first emitting area is a blue emitting area, the second emitting area is a green emitting area, and the third emitting area is a red emitting area.

15. The display device according to claim 13, wherein a first size of an emitting area on a first side of the white emitting area is different from a second size of another emitting area on a second side of the white emitting area, the second side of the white emitting area opposite to the first side of the white emitting area.

16. A display device comprising:
a lower substrate including a display area;
a light emitting structure on the lower substrate, the light emitting structure emitting white light;
an upper substrate disposed on the display area of the lower substrate, the upper substrate including:
a first non-emitting area between a first emitting area and a second emitting area, the first non-emitting area between a white emitting area and the first emitting area, a second non-emitting area between the white emitting area and the second emitting area, the second non-emitting area between the first emitting area and the second emitting area; and a third non-emitting area between the white emitting area and a third emitting area;

a first color filter overlapping the first emitting area and at least part of the first non-emitting area;

a second color filter overlapping the second emitting area, the second color filter extending by:

(i) a first distance into a first portion of the first color filter in the first non-emitting area to block the white light from emitting from the first portion; and (ii) a second distance into a second portion of the second non-emitting area to prevent leaking of the white light through the second portion, wherein the second distance is greater than the first distance; and a third color filter overlapping the third emitting area, the third color filter having a same color as the second color filter, wherein a third distance of the first color filter extending onto the first non-emitting area of the upper substrate is greater than a fourth distance of the first color filter extending onto the second non-emitting area of the upper substrate.

17. The display device according to claim 16, wherein the third color filter extends by a fifth distance into a third portion of the third non-emitting area to prevent leaking of the white light through the third portion, and wherein the fifth distance is greater than the first distance.

18. The display device according to claim 17, wherein the first color filter has a first width, the second color filter has a second width, and the third color filter has a third width different than the second width, and wherein the first width is greater than each of the second and third widths.

19. The display device according to claim 17, wherein the first color filter has a first width, the second color filter has a second width, and the third color filter has a third width substantially equal to the second width, and wherein a sum of the second and third widths substantially equals the first width.

20. The display device according to claim 17, further comprising:

a fourth color filter having the same color as the second color filter; and a fifth color filter having the same color as the second color filter, the white emitting area adjacent to the fourth color filter and the fifth color filter in a second direction orthogonal to the first direction of the display device.

\* \* \* \* \*